(12) United States Patent
Chen et al.

(10) Patent No.: US 10,194,556 B2
(45) Date of Patent: Jan. 29, 2019

(54) SLIDE RAIL MECHANISM AND BRACKET DEVICE THEREOF

(71) Applicants: KING SLIDE WORKS CO., LTD., Kaohsiung (TW); KING SLIDE TECHNOLOGY CO.,LTD., Kaohsiung (TW)

(72) Inventors: Ken-Ching Chen, Kaohsiung (TW); Shun-Ho Yang, Kaohsiung (TW); Wei-Chen Chang, Kaohsiung (TW); Chun-Chiang Wang, Kaohsiung (TW)

(73) Assignees: KING SLIDE WORKS CO., LTD., Kaohsiung (TW); KING SLIDE TECHNOLOGY CO., LTD., Kaohsiung (TW)

( * ) Notice: Subject to any disclaimer, the term of this patent is extended or adjusted under 35 U.S.C. 154(b) by 0 days.

(21) Appl. No.: 15/610,649

(22) Filed: Jun. 1, 2017

(65) Prior Publication Data
US 2018/0220797 A1     Aug. 9, 2018

(30) Foreign Application Priority Data
Feb. 9, 2017   (TW) .............................. 106104550 A

(51) Int. Cl.
| A47B 88/40 | (2017.01) |
| H05K 7/14 | (2006.01) |
| H05K 7/18 | (2006.01) |
| A47B 88/423 | (2017.01) |
| A47B 96/07 | (2006.01) |
| A47B 88/44 | (2017.01) |

(52) U.S. Cl.
CPC ............ *H05K 7/183* (2013.01); *A47B 88/423* (2017.01); *A47B 88/44* (2017.01); *A47B 96/07* (2013.01); *H05K 7/1421* (2013.01); *H05K 7/1489* (2013.01)

(58) Field of Classification Search
CPC ....... A47B 88/43; A47B 96/07; A47B 96/067; A47B 96/061; A47B 88/44; A47B 96/068; H05K 7/1489; H05K 7/183; H05K 7/1421
USPC ... 248/27.1, 220.21, 221.11, 225.11, 222.11, 248/250; 312/334.7, 334.8, 334.46, 312/334.44; 211/26, 86.01, 123
See application file for complete search history.

(56) References Cited

U.S. PATENT DOCUMENTS

| 8,550,416 B2* | 10/2013 | Yu ......................... H05K 7/1489 248/241 |
| 9,629,460 B1 | 4/2017 | Chen |
| 9,681,573 B2* | 6/2017 | Chen .................... H05K 7/1489 |

(Continued)

FOREIGN PATENT DOCUMENTS

CN      103945671         1/2017

*Primary Examiner* — Tan Le
(74) *Attorney, Agent, or Firm* — Winston Hsu

(57) ABSTRACT

A slide rail mechanism includes a rail member, a supporting frame and a bracket. The supporting frame is movable relative to the rail member and the bracket. The bracket includes a side wall and at least one mounting member adjacent to the side wall. The at least one mounting member configured to pass through a mounting hole of a post. When the supporting frame is moved relative to the bracket from a first position to a second position, the supporting frame is configured to drive the at least one mounting member to move relative to the side wall.

17 Claims, 8 Drawing Sheets

(56) References Cited

U.S. PATENT DOCUMENTS

| | | | |
|---|---|---|---|
| 2016/0029791 A1* | 2/2016 | Chen | H05K 7/183 |
| | | | 312/334.44 |
| 2017/0055707 A1* | 3/2017 | Chen | A47B 88/407 |
| 2017/0095079 A1* | 4/2017 | Chen | H05K 7/1489 |
| 2018/0125234 A1* | 5/2018 | Chen | H05K 7/1489 |

* cited by examiner

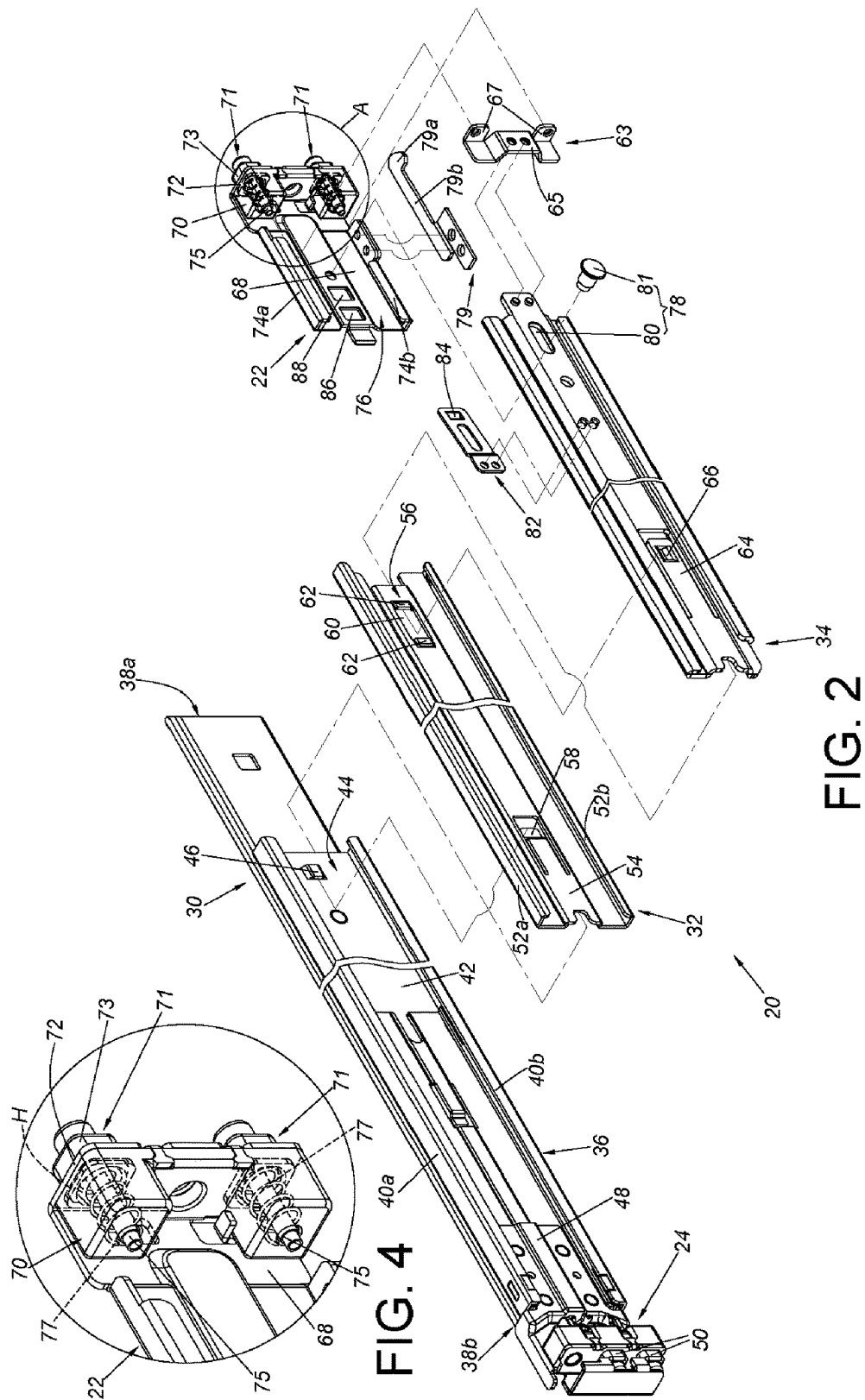

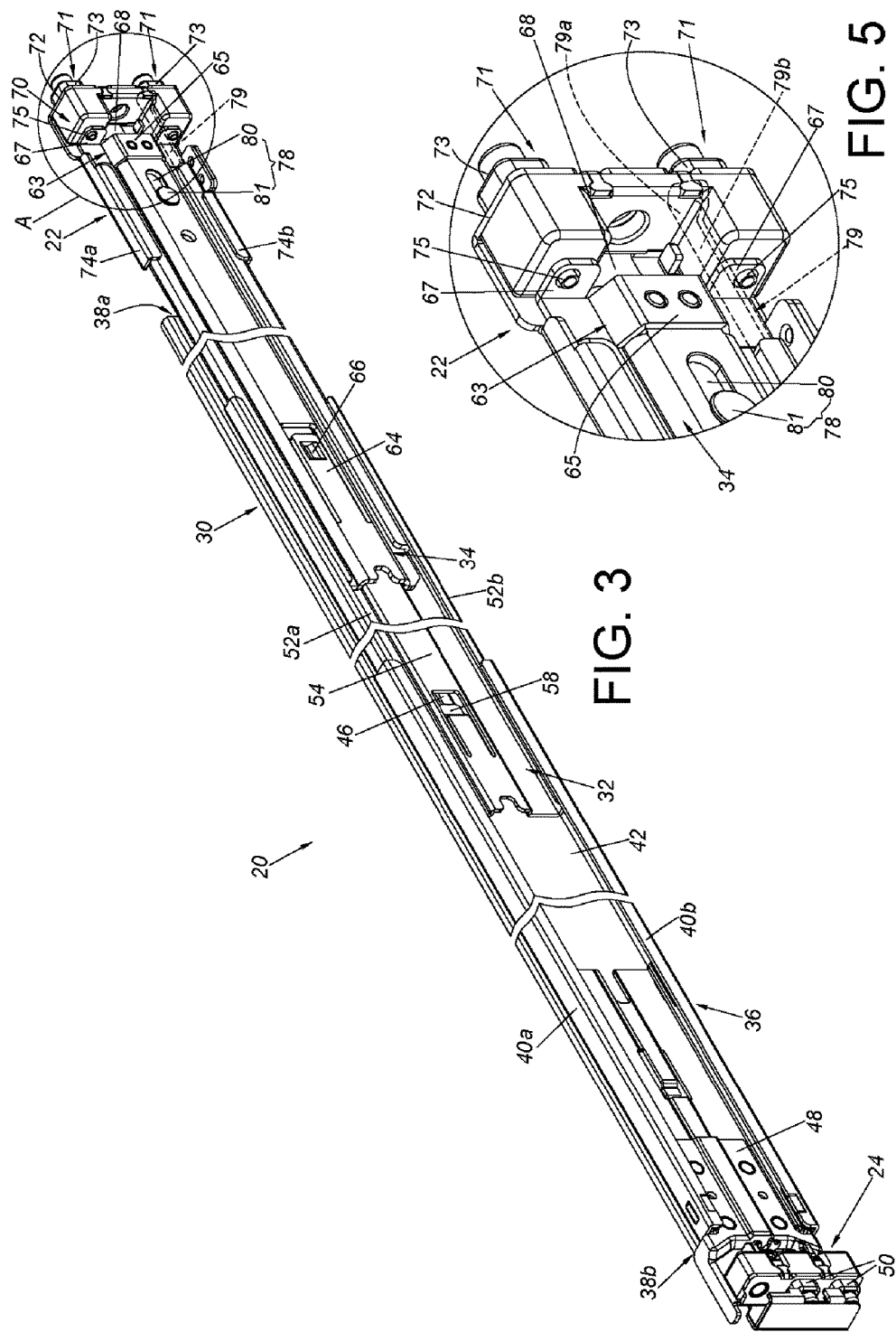

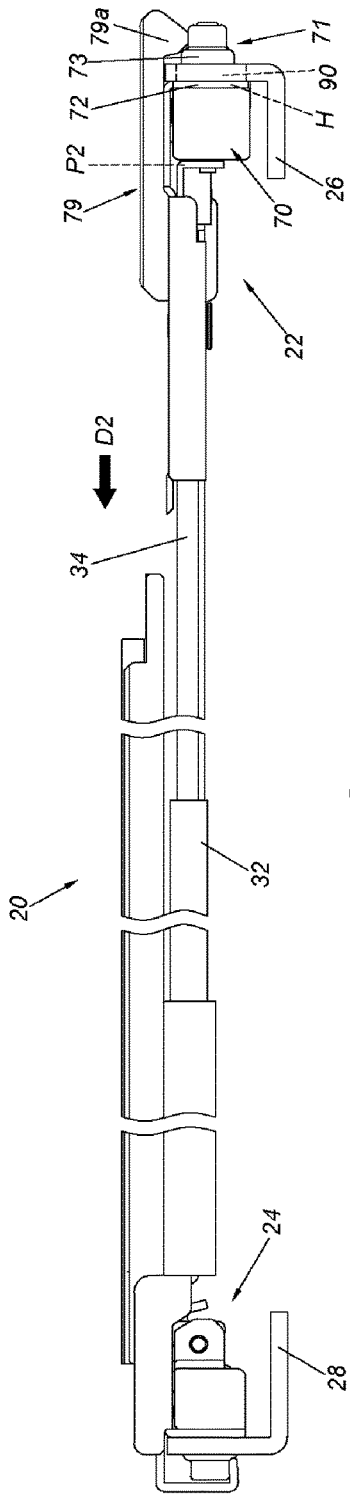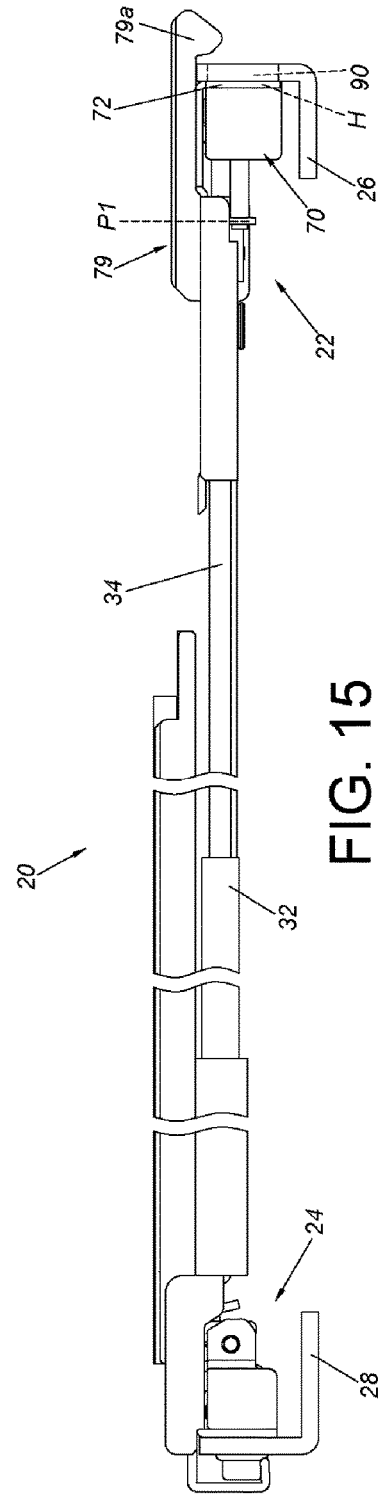

SLIDE RAIL MECHANISM AND BRACKET DEVICE THEREOF

BACKGROUND OF THE INVENTION

1. Field of the Invention

The present invention relates to a slide rail mechanism, and more particularly, to a slide rail mechanism configured to mount a slide rail to posts of a rack.

2. Description of the Prior Art

China patent publication number CN 102695396B discloses a tool-free slide rail mounting frame for server. The tool-free slide rail mounting frame for server comprises a pair of rack positioning columns (4) arranged on a slide rail rear mounting frame (1) and a rack floating hook (2). The rack floating hook (2) comprises a pair of hooks (203) respectively arranged on a pair of wings (205). The wings (205) are respectively provided with slide guiding sleeves (201) and are in fixed connection through an arch-shaped bending member (206). The slide rail rear mounting frame (1) is fixed with two slide guiding columns (101). The slide guiding columns (101) are sleeved in the slide guiding sleeves (201) and are in fixed connection through limit screws (7). First return springs are arranged on the slide guiding sleeves (201) and between the wings (205) and the limit screws (7). The slide rail rear mounting frame (1) is further provided with a floating pin hole for placing a floating pin (3). One end of the floating pin (3) is connected to the arch-shaped bending member (206) through the limit screws (7), and the other end of the floating pin is a conical head (301) arranged in the floating pin hole (104). Second return springs are arranged on the floating pin (3) and between an end face of the conical head (301) and the limit screws (7).

According to the above arrangement, the tool-free slide rail mounting frame for server can be driven by an outer rail covered by a rear frame through the floating pin (3), so as to lock/release the slide rail rear mounting frame (1). However, the design disclosed in the prior art is limited to a length of the outer rail and adjustable degree of a bracket cooperated with the outer rail, such that usage of the tool-free slide rail mounting frame for server is limited accordingly. In other words, the outer rail is required to be long enough to lock/release the rear slide rail mounting frame (1).

SUMMARY OF THE INVENTION

The present invention relates to a slide rail mechanism capable of driving at least one mounting member through a supporting frame.

According to an embodiment of the present invention, a slide rail mechanism comprises a rail member, a first supporting frame, a second supporting frame and a first bracket. The first supporting frame is movable relative to the rail member. The second supporting frame is movable relative to the first supporting frame. The first bracket and the second supporting frame are movable relative to each other. The first bracket comprises a side wall and at least one mounting member adjacent to the side wall. The at least one mounting member is configured to pass through a mounting hole of a post. Wherein, during a process of the second supporting frame being moved relative to the first bracket along a direction from a first position to a second position, the second supporting frame is configured to drive the at least one mounting member to move relative to the side wall of the first bracket.

Preferably, the slide rail mechanism further comprises a supporting rail connected to the rail member. The supporting rail has a supporting passage. The first supporting frame is movable relative to the rail member through the supporting passage Preferably, the supporting rail has a first limiting feature located within the supporting passage. The first supporting frame has a second limiting feature. The second limiting feature is located at a position corresponding to the first limiting feature.

Preferably, one of the first supporting frame and the second supporting frame has a passage. The first supporting frame and the second supporting frame are movable relative to each other through the passage.

Preferably, the first supporting frame has an opening and at least one contact wall adjacent to the opening. The second supporting frame comprises an abutting part configured to pass through the opening of the first supporting frame. The abutting part is smaller than the opening.

Preferably, one of the first bracket and the second supporting frame comprises a first wall section, a second wall section and a side wall connected between the first wall section and a second wall section. A space is defined by the first wall section, the second wall section and the side wall. The first bracket and the second supporting frame are movable relative to each other through the space.

Preferably, the first bracket further comprises a base adjacent to the side wall. The at least one mounting member is movably mounted to the base.

Preferably, the first bracket further comprises an end wall substantially perpendicularly connected to the side wall. The base is attached to the end wall. The slide rail mechanism further comprises a fastening member connected to the first bracket. The fastening member comprises a fastening part in front of the end wall.

Preferably, the slide rail mechanism further comprises a driving structure arranged on the second supporting frame. During the process of the second supporting frame being moved relative to the first bracket along the direction from the first position to the second position, the driving structure is configured to drive the at least one mounting member to move relative to the side wall of the first bracket.

Preferably, the driving structure comprises at least one driving part. The at least one mounting member comprises a mounting part and a contact part connected to the mounting part. The at least one driving part of the driving structure is connected to the contact part of the at least one mounting member for driving the mounting part to move. The slide rail mechanism further comprises at least one auxiliary elastic member configured to provide an elastic force to the at least one mounting member.

Preferably, the first bracket is adjacent to a first end part of the rail member. The slide rail mechanism further comprises a second bracket adjacent to a second end part of the rail member.

According to another embodiment of the present invention, a bracket device comprises a bracket and a supporting frame. The bracket comprises a side wall and at least one mounting member adjacent to the side wall. The supporting frame is movable relative to the bracket. The at least one mounting member is configured to pass through a mounting hole of a post. During a process of the supporting frame being moved relative to the bracket along a direction from a first position to a second position, the supporting frame is configured to drive the at least one mounting member to move relative to the side wall of the bracket.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 2 is an exploded view of the slide rail mechanism according to an embodiment of the present invention.

FIG. 3 is a diagram showing the slide rail mechanism according to an embodiment of the present invention.

FIG. 4 is an enlarged view of an area A of FIG. 2.

FIG. 5 is an enlarged view of an area A of FIG. 3.

FIG. 14 is a diagram showing the slide rail mechanism being mounted to the first post and the second post according to an embodiment of the present invention.

FIG. 15 is a diagram showing the bracket of the slide rail mechanism being detached from the first post according to an embodiment of the present invention.

DETAILED DESCRIPTION

Figure 1:
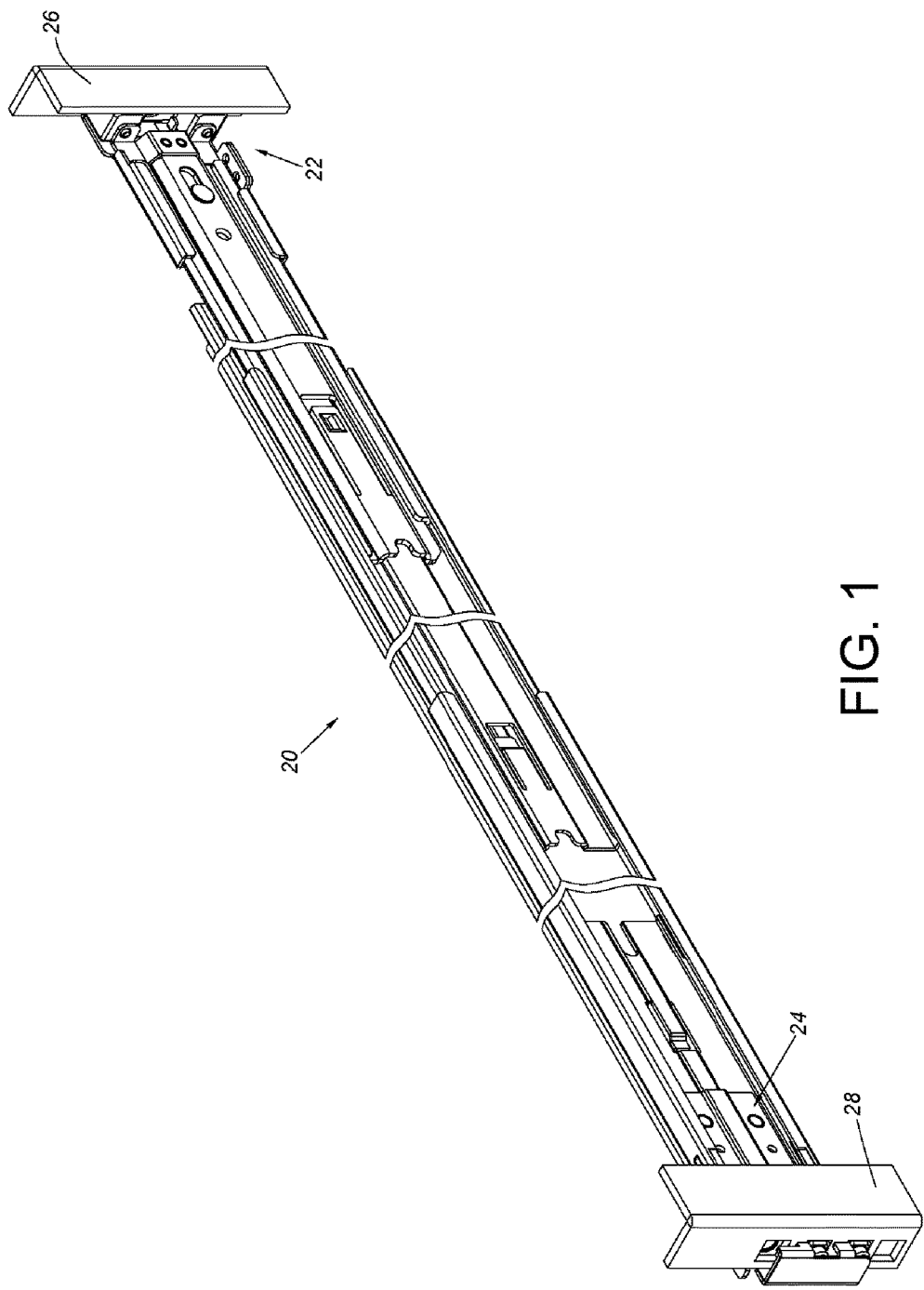
FIG. 1 is a diagram showing a slide rail mechanism being mounted to a first post and a second post according to an embodiment of the present invention.

As shown in FIG. 1, a slide rail mechanism 20 can be mounted to a first post 26 and a second post 28 of a rack respectively through a first bracket 22 and a second bracket 24 according an embodiment of the present invention.

As shown in FIG. 2 and FIG. 3, the slide rail mechanism 20 comprises a rail member 30, a first supporting frame 32, a second supporting frame 34 and the first bracket 22. Preferably, the slide rail mechanism 20 further comprises a supporting rail 36.

The rail member 30 has a first end part 38a and a second end part 38b opposite to the first end part 38a.

The supporting rail 36 is connected, such as fixedly connected, to a back side of the rail member 30, such that the supporting rail 36 can be seen as a portion of the rail member 30. For example, the supporting rail 36 can be connected to the rail member 30 by riveting, screwing or welding. Furthermore, the supporting rail 36 comprises an upper wall 40a, a lower wall 40b and a longitudinal wall 42 connected between the upper wall 40a and the lower wall 40b. A supporting passage 44 is defined by the upper wall 40a, the lower wall 40b and the longitudinal wall 42. Preferably, the longitudinal wall 42 has a first limiting feature 46 arranged within the supporting passage 44. In the present embodiment, the first limiting feature 46 is a protrusion. The second bracket 24 has a side wall 48 and at least one mounting member 50 located adjacent to one end of the side wall 48. The side wall 48 is connected to the longitudinal wall 42 of the supporting rail 36. In the present embodiment, the second bracket 24 has two mounting members 50. Preferably, the second bracket 24 is located adjacent to the second end part 38b of the rail member 30.

The first supporting frame 32 is movable relative to the rail member 30. For example, a portion of the first supporting frame 32 is movably mounted within the supporting passage 44 of the supporting rail 36. The first supporting frame 32 is movable relative to the rail member 30 through the supporting passage 44 of the supporting rail 36, but the present invention is not limited thereto. The first supporting frame 32 has an upper supporting wall 52a, a lower supporting wall 52b and a longitudinal wall 54 connected between the upper supporting wall 52a and the lower supporting wall 52b. A passage 56 is defined by the upper supporting wall 52a, the lower supporting wall 52b and the longitudinal wall 54. Furthermore, the first supporting frame 32 has a second limiting feature 58. The second limiting feature 58 is connected to the longitudinal wall 54 of the first supporting frame 32, and located at a position corresponding to the first limiting feature 46 of the supporting rail 36. In the present embodiment, the second limiting feature 58 is an extension arm. Preferably, the first supporting frame 32 further has an opening 60 and at least one contact wall 62 adjacent to the opening 60. Wherein, the opening 60 is substantially longitudinally arranged.

The second supporting frame 34 is movable relative to the first supporting frame 32. For example, a portion of the second supporting frame 34 is movably mounted within the passage 56 of the first supporting frame 32. The second supporting frame 34 is movable relative to the first supporting frame 32 through the passage 56 of the first supporting frame 32, but the present invention is not limited thereto. Furthermore, a driving structure 63 is arranged on the second supporting frame 34. The driving structure 63 can be an additional component connected (such as fixedly connected) to the second supporting frame 34; or, the driving structure 63 can be integrally formed on the second supporting frame 34. Briefly, the driving structure 63 can be seen as a portion of the second supporting frame 34. In particular, the driving structure 63 comprises a connecting part 65 and at least one driving part 67. In the present embodiment, the connecting part 65 is connected to an end part of the second supporting frame 34, and the at least one driving part 67 is bent relative to the connecting part 65, but the present invention is not limited thereto.

Preferably, the second supporting frame 34 further comprises an elastic arm 64 and an abutting part 66 arranged on the elastic arm 64. Wherein, the elastic arm 64 is extended from the second supporting frame 34. The abutting part 66 is configured to pass through the opening 60 of the first supporting frame 32. The abutting part 66 is smaller than the opening 60.

The first bracket 22 and the second supporting frame 34 are movable relative to each other. Preferably, the first bracket 22 is movably mounted to the second supporting frame 34 and is adjustable to be adjacent to the first end part 38a of the rail member 30.

As shown in FIG. 4, the first bracket 22 comprises a side wall 68 and at least one mounting member 71. Preferably, the first bracket 22 further comprises an end wall 72 and a base 70.

The end wall 72 is substantially perpendicularly connected to the side wall 68. The base is arranged adjacent to the side wall 68. In the present embodiment, the base 70 is attached to the end wall 72. The at least one mounting member 71 is movable relative to the side wall 68. For example, the at least one mounting member 71 is movably mounted to the base 70 and movable relative to the slide wall 68. Preferably, the end wall 72 has at least one through hole H, and the at least one mounting member 71 comprises a mounting part 73 and a contact part 75. Wherein, the mounting part 73 is located at a position corresponding to the through hole H of the end wall 72, and the mounting part 73 is smaller than the through hole H. Preferably, the contact part 75 is connected to the mounting part 73 and extended from the mounting part 73. Preferably, the slide rail mechanism 20 further comprises at least one auxiliary elastic member 77 configured to provide an elastic force to the at least one mounting member 71. Wherein, the auxiliary elastic member 77 can be mounted to the base 70.

As shown in FIG. 2, FIG. 3 and FIG. 5, the driving structure 63 is configured to drive the at least one mounting member 71 to move relative to the side wall 68 of the first bracket 22. In the present embodiment, the at least one driving part 67 of the driving structure 63 is connected to the contact part 75 of the at least one mounting member 71. Preferably, the slide rail mechanism 20 further comprises a fastening member 79. The fastening member 79 can be an additional component connected (such as fixedly connected) to the first bracket 22; or, the fastening member 79 can be integrally formed on the first bracket 22. Briefly, the fastening member 79 can be seen as a portion of the first bracket 22. Preferably, the fastening member 79 has a fastening part 79a and an arm part 79b. The fastening part 79a is connected to the arm part 79b.

Furthermore, one of the first bracket 22 and the second supporting frame 34 is arranged with a first wall section and a second wall section to define a space therebetween. In the present embodiment, an upper part and a lower part of the side wall 68 of the first bracket 22 are respectively arranged with a first wall section 74a and a second wall section 74b, and a space 76 is defined between the first wall section 74a and the second wall section 74b. The first bracket 22 and the second supporting frame 34 are movable relative to each other through the space 76. Wherein, the first bracket 22 and the second supporting frame 34 can be seen as a bracket device. Preferably, the bracket device further comprises the first supporting frame 32, so as to be a bracket device having two supporting frames.

Preferably, one of the first bracket 22 and the second supporting frame 34 comprises a limiting structure 78. The second supporting frame 34 and the first bracket 22 are movable relative to each other within a limited range defined by the limiting structure 78. Preferably, the limiting structure 78 comprises a bounded elongated hole 80 and a connecting member 81 passing through a portion of the elongated hole 80 for connecting the second supporting frame 34 to the first bracket 22. In the present embodiment, the second supporting frame 34 has the elongated hole 80.

As shown in FIG. 2, the slide rail mechanism 20 further comprises an elastic member 82 attached to the second supporting frame 34. For example, the elastic member 82 can be connected to the second supporting frame 34 by riveting or screwing. The elastic member 82 has a first engaging feature 84. On the other hand, the first bracket 22 comprises a second engaging feature 86 and a third engaging feature 88. The first engaging feature 84 is configured to be engaged with one of the second engaging feature 86 and the third engaging feature 88. Wherein, the first engaging feature 84 can be a convex structure, and the second engaging feature 86 and the third engaging feature 88 can be concave structures (or holes), or vice versa. For example, the first engaging feature 84 is a protrusion, and the second engaging feature 86 and the third engaging feature 88 are positioning holes, but the present invention is not limited thereto.

Figure 6:
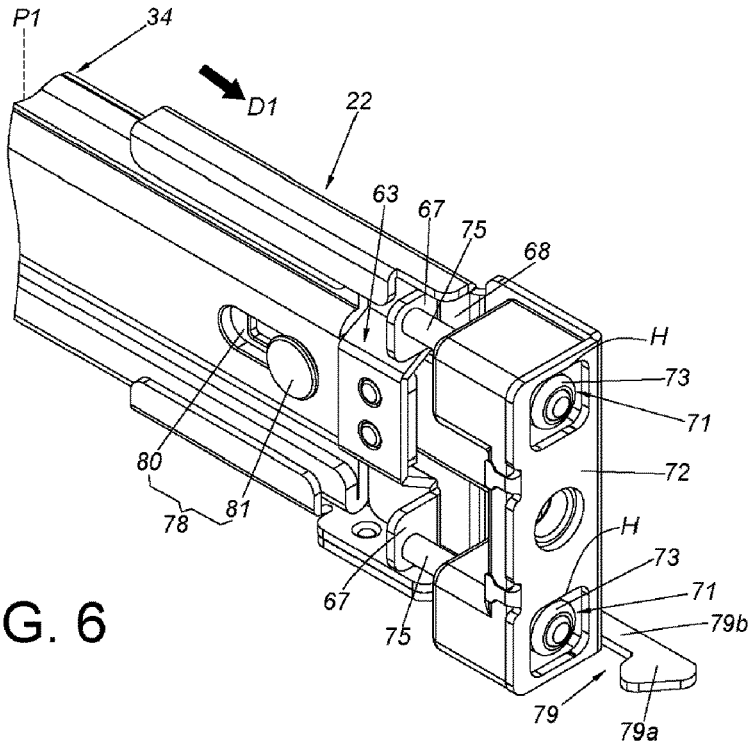
FIG. 6 is a diagram showing a supporting frame of the slide rail mechanism located at a first position relative to a bracket according to an embodiment of the present invention.

As shown in FIG. 6, the second supporting frame 34 can be operated to locate at a first position P1 relative to the first bracket 22. Wherein, the at least one driving part 67 of the driving structure 63 is located at a position corresponding to the contact part 75 of the at least one mounting member 71, and the mounting part 73 of the at least one mounting member 71 can be entirely or partially retracted into the through hole H of the end wall 72.

Figure 7:
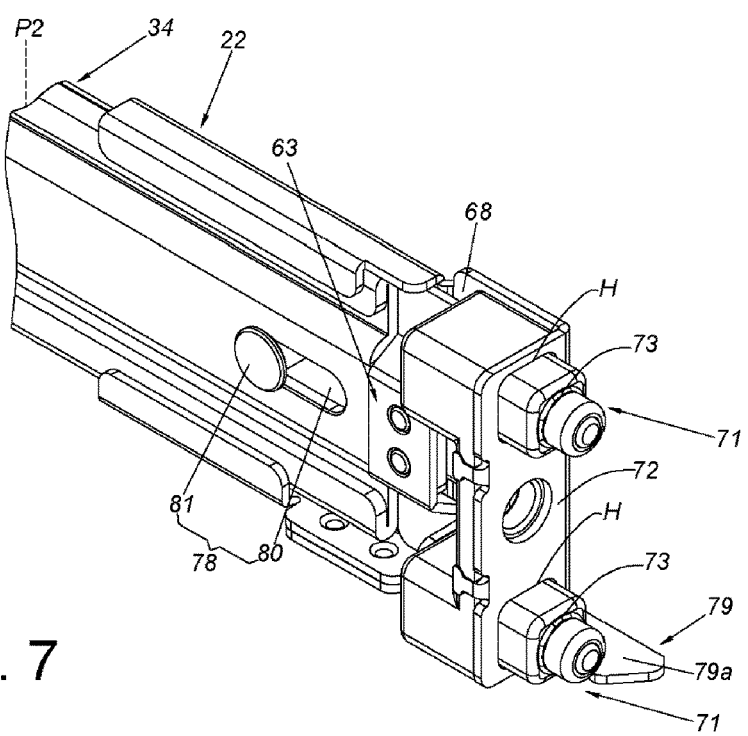
FIG. 7 is a diagram showing the supporting frame of the slide rail mechanism located at a second position relative to the bracket according to an embodiment of the present invention.

As shown in FIG. 7, the second supporting frame 34 can be operated to move relative to the first bracket 22 along a first direction D1 from the first position P1 to a second position P2. Wherein, during a process of the second supporting frame 34 being moved from the first position P1 to the second position P2, the at least one driving part 67 of the driving structure 63 is configured to drive the at least one mounting member 71 to move relative to the side wall 68 of the first bracket 22 through the contact part 75, such that the mounting part 73 of the at least one mounting member 71 can be entirely or partially extended out of the through hole H of the end wall 72. Wherein, through arrangement of the elongated hole 80 and the connecting member 81 of the limiting structure 78, the second supporting frame 34 can be moved relative to the first bracket 22 within a limited range between the first position P1 and the second position P2.

Figure 8:
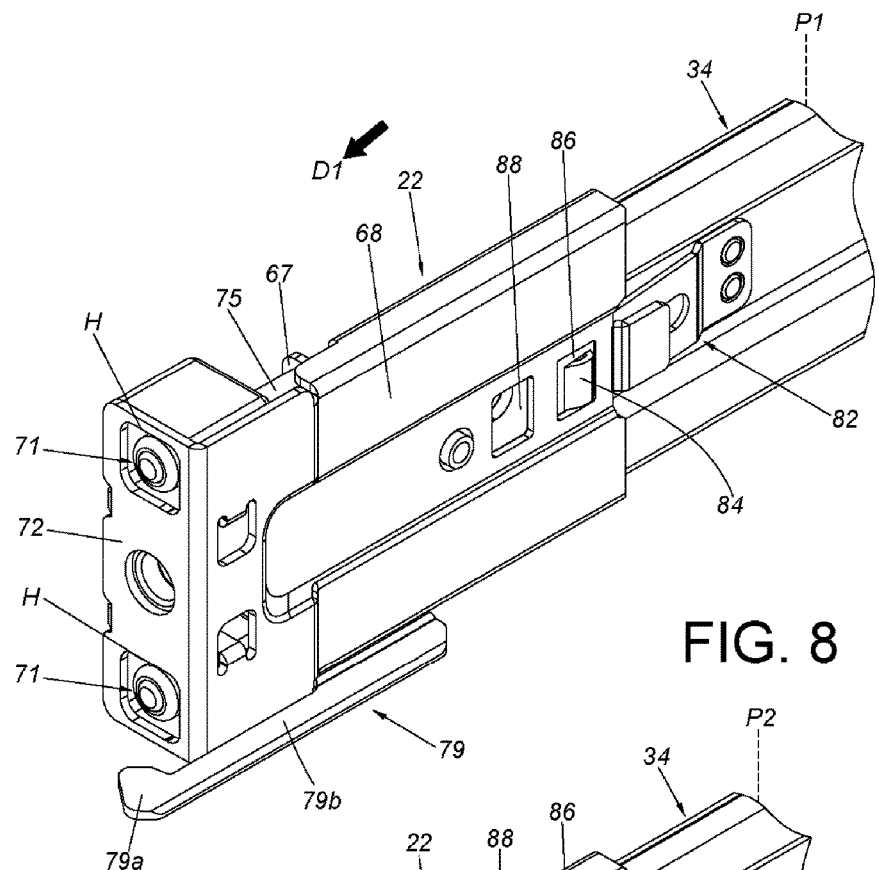
FIG. 8 is a diagram showing an elastic member being engaged with a feature of the bracket to hold the supporting frame of the slide rail mechanism at the first position relative to the bracket according to an embodiment of the present invention.

As shown in FIG. 8, the arm part 79b of the fastening member 79 extends beyond the end wall 72 from the side wall 68 of the first bracket 22, such that the fastening part 79a is in front of the at least one mounting member 71 and/or the end wall 72. Furthermore, when the second supporting frame 34 is located at the first position P1 relative to the first bracket 22, the first engaging feature 84 of the elastic member 82 is engaged with the second engaging feature 86 of the first bracket 22, such that the second supporting frame 34 can be temporarily held at the first position P1.

Figure 9:
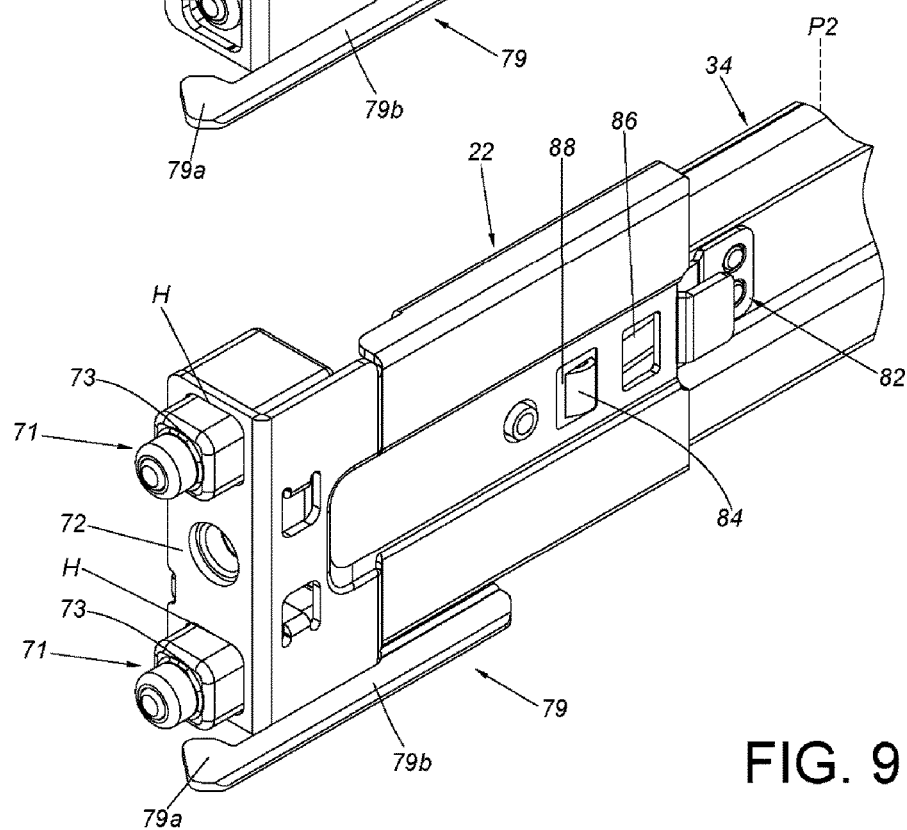
FIG. 9 is a diagram showing the elastic member being engaged with another feature of the bracket to hold the supporting frame of the slide rail mechanism at the second position relative to the bracket according to an embodiment of the present invention.

Preferably, as shown in FIG. 9, when the second supporting frame 34 is operated to move relative to the first bracket 22 along the first direction D1 from the first position P1 to the second position P2, the first engaging feature 84 of the elastic member 82 is engaged with the third engaging feature 88 of the first bracket 22, such that the second supporting frame 34 can be temporarily held at the second position P2.

Figure 10:
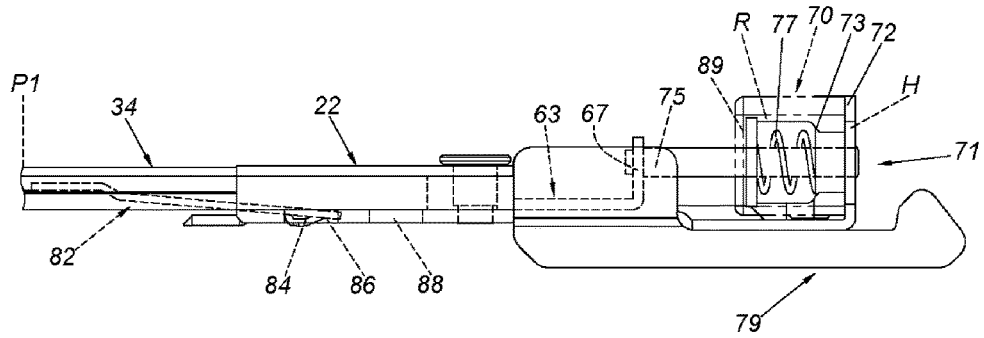
FIG. 10 is a diagram showing the supporting frame of the slide rail mechanism being at the first position relative to the bracket according to an embodiment of the present invention.

As shown in FIG. 10, the auxiliary elastic member 77 is preferably mounted in an accommodating room R of the base 70. The auxiliary elastic member 77 is configured to abut against an inner wall 89 of the accommodating room R and the mounting part 73 of the at least one mounting member 71. Furthermore, the second supporting frame 34 is located at the first position P1 relative to the first bracket 22. Wherein, the at least one driving part 67 of the driving structure 63 is located at the position corresponding to the contact part 75 of the at least one mounting member 71, and the mounting part 73 of the at least one mounting member 71 can be entirely or partially retracted into the through hole H of the end wall 72. Preferably, when the second supporting frame 34 is located at the first position P1, the auxiliary elastic member 77 is in a first state (such as in a state of accumulating an elastic force), and the first engaging feature 84 of the elastic member 82 is engaged with the second engaging feature 86 of the first bracket 22, such that the second supporting frame 34 is held at the first position P1 and the auxiliary elastic member 77 is held in the first state.

Figure 11:
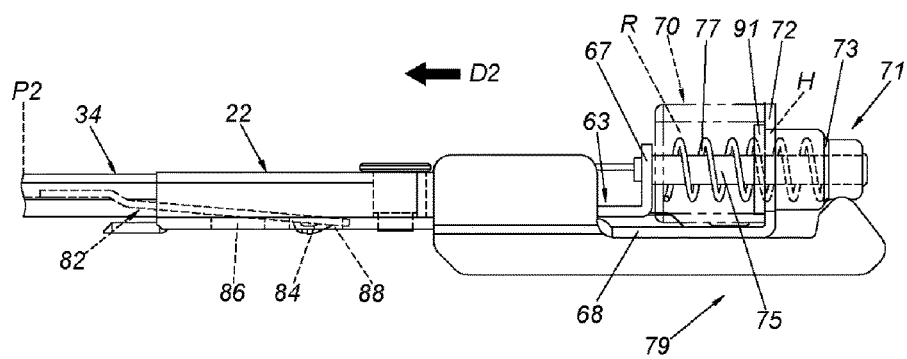
FIG. 11 is a diagram showing the supporting frame of the slide rail mechanism located at the second position relative to the bracket according to an embodiment of the present invention.

As shown in FIG. 11, during the process of the second supporting frame 34 being moved from the first position P1 to the second position P2, the at least one driving part 67 of the driving structure 63 is configured to drive the at least one mounting member 71 to move relative to the side wall 68 of the first bracket 22, such that the mounting part 73 of the at least one mounting member 71 can be entirely or partially extended out of the through hole H of the end wall 72. Preferably, when the second supporting frame 34 is located at the second position P2, the auxiliary elastic member 77 is in a second state (such as in a state of not accumulating the elastic force), and the first engaging feature 84 of the elastic member 82 is engaged with the third engaging feature 88 of the first bracket 22, such that the second supporting frame 34 is held at the second position P2 and the auxiliary elastic member 77 is held in the second state. Preferably, when the mounting pat 73 of the at least one mounting member 71 is extended out of the through hole H, the at least one mounting member 71 is configured to abut against the base 70 or the end wall 72 through an extension leg 91.

Specifically, when the first engaging feature 84 of the elastic member 82 is operatively disengaged from the third engaging feature 88 of the first bracket 22, the second supporting frame 34 can return to the first position P1 from the second position P2 relative to the first bracket 22 along a second direction D2 (a direction opposite to the first direction D1).

Figure 12:
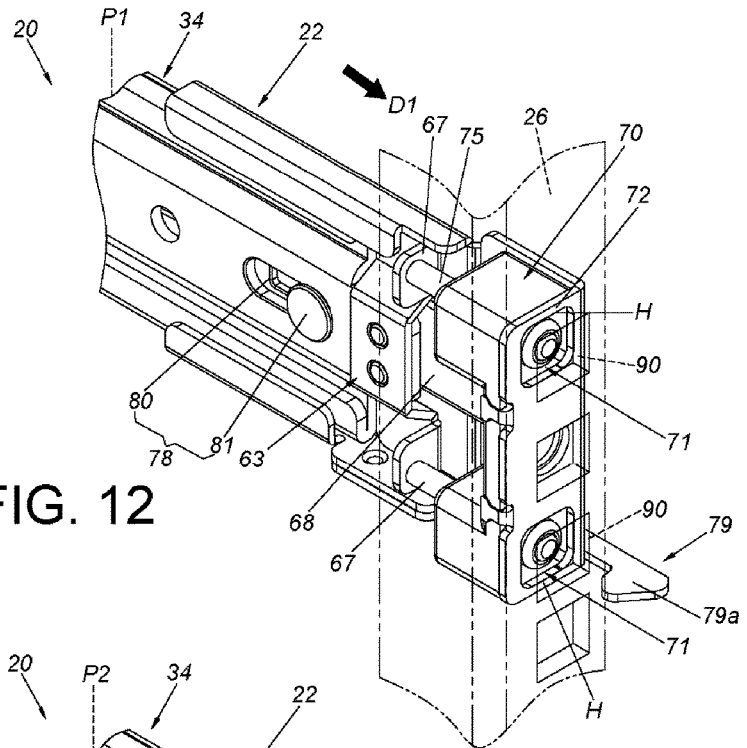
FIG. 12 is a diagram showing the supporting frame of the slide rail mechanism located at the first position relative to the bracket with the bracket abutting against the first post according to an embodiment of the present invention.

As shown in FIG. 12, when a user is going to mount the slide rail mechanism 20 to the rack, the second supporting frame 34 is configured to be located at the first position P1 relative to the first bracket 22 in advance. Thereafter, the user can move the slide rail mechanism 20 toward the first post 26 laterally, so as to allow the fastening part 79*a* of the fastening member 79 to be located in front of the first post 76 for locking the first post 26 (or a target object). Moreover, the user can further move the slide rail mechanism 20 along the first direction D1, so as to allow a portion of the first bracket 22 (such as the end wall 72) to abut against the first post 26.

Figure 13:
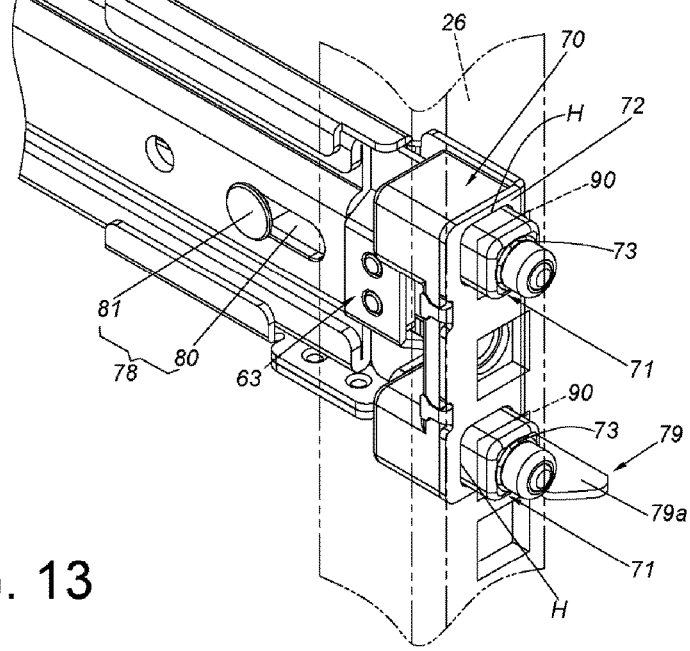
FIG. 13 is a diagram showing the supporting frame of the slide rail mechanism located at the second position relative to the bracket with the bracket being mounted to the first post according to an embodiment of the present invention.

As shown in FIG. 13, the second supporting frame 34 can be operated to move relative to the first bracket 22 along the first direction D1 from the first position P1 to the second position P2. Wherein, during the processing of the second supporting frame 34 being moved from the first position P1 to the second position P2, the at least one driving part 67 of the driving structure 63 is configured to drive the at least one mounting member 71 to move along the first direction D1 relative to the side wall 68 of the first bracket 22 through the contact part 75, such that the mounting part 73 of the at least one mounting member 71 can be entirely or partially extended out of the through hole H of the end wall 72 to enter and pass through a corresponding mounting hole 90 of the first post 26, so as to mount the first bracket 22 of the slide rail mechanism 20 to the first post 26.

As shown in FIG. 14, after the first bracket 22 of the slide rail mechanism 20 is mounted to the first post 26, the first supporting frame 32 can be adjusted to move relative to the second supporting frame 34, so as to mount the second bracket 24 of the slide rail mechanism 20 to the second post 28. Therefore, the operation of mounting the slide rail mechanism 20 to the rack is completed. Wherein, since a process of mounting the second bracket 24 to the second post 28 is well known to those skilled in the art, no further illustration is provided for simplification.

As shown in FIG. 15, when the user is going to detach the first bracket 22 from the first post 26, the user can operate the second supporting frame 34 to move relative to the first bracket 22 along the second direction D2 from the second position P2 to the first position P1 (please also refer to FIG. 13 and FIG. 12), such that the mounting part 73 of the at least one mounting member 71 is detached from the corresponding mounting hole 90 of the first post 26 and retracted into the through hole H of the end wall 72 to enter the base 70. Accordingly, the fastening part 79*a* of the fastening member 79 can be moved away from the first post 26, so as to detach the first bracket 22 from the first post 26.

Therefore, the slide rail mechanism of the present invention is characterized in that:

1. The second supporting frame 34 is configured to drive the at least one mounting member 71 to move relative to the side wall 68 of the first bracket, wherein the at least one mounting member 71 is configured to be mounted to a corresponding mounting hole of a post (such as the first post 26).
2. The fastening member 79 is fixed relative to the first bracket 22, and the fastening part 79*a* of the fastening member 79 is in front of the at least one mounting member 71 and/or the end wall 72, wherein the fastening part 79*a* of the fastening member 79 is configured to lock a post (such as the first post 26).
3. The elastic member 81 can be engaged with the second engaging feature 86 or the third engaging feature 88 of the first bracket 22, such that the second supporting frame 34 can be temporarily held at the first position P1 or the second position P2 relative to the first bracket 22.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A slide rail mechanism, comprising:
    a rail member;
    a first supporting frame movable relative to the rail member;
    a second supporting frame movable relative to the first supporting frame;
    a first bracket, the first bracket and the second supporting frame being movable relative to each other, the first bracket comprising a side wall and at least one mounting member adjacent to the side wall, the at least one mounting member configured to pass through a mounting hole of a post, the first bracket being adjacent to a first end part of the rail member; and
    a second bracket adjacent to a second end part of the rail member;

wherein during a process of the second supporting frame being moved relative to the first bracket along a direction from a first position to a second position, the second supporting frame is configured to drive the at least one mounting member to move relative to the side wall of the first bracket.

2. The slide rail mechanism of claim 1, further comprising a supporting rail connected to the rail member, wherein the supporting rail has a supporting passage, and the first supporting frame is movable relative to the rail member through the supporting passage.

3. The slide rail mechanism of claim 2, wherein the supporting rail has a first limiting feature located within the supporting passage, the first supporting frame has a second limiting feature, and the second limiting feature is located at a position corresponding to the first limiting feature.

4. The slide rail mechanism of claim 1, wherein one of the first supporting frame and the second supporting frame has a passage, the first supporting frame and the second supporting frame are movable relative to each other through the passage.

5. The slide rail mechanism of claim 4, wherein the first supporting frame has an opening and at least one contact wall adjacent to the opening, the second supporting frame comprises an abutting part configured to pass through the opening of the first supporting frame, and the abutting part is smaller than the opening.

6. The slide rail mechanism of claim 1, wherein one of the first bracket and the second supporting frame comprises a first wall section, a second wall section and a side wall connected between the first wall section and a second wall section, a space is defined by the first wall section, the second wall section and the side wall, the first bracket and the second supporting frame are movable relative to each other through the space.

7. The slide rail mechanism of claim 1, wherein the first bracket further comprises a base adjacent to the side wall, and the at least one mounting member is movably mounted to the base.

8. The slide rail mechanism of claim 7, wherein the first bracket further comprises an end wall substantially perpendicularly connected to the side wall, the base is attached to the end wall, the slide rail mechanism further comprises a fastening member connected to the first bracket, and the fastening member comprises a fastening part in front of the end wall.

9. The slide rail mechanism of claim 8, further comprising a driving structure arranged on the second supporting frame, wherein during the process of the second supporting frame being moved relative to the first bracket along the direction from the first position to the second position, the driving structure is configured to drive the at least one mounting member to move relative to the side wall of the first bracket.

10. The slide rail mechanism of claim 9, wherein the driving structure comprises at least one driving part, the at least one mounting member comprises a mounting part and a contact part connected to the mounting part, the at least one driving part of the driving structure is connected to the contact part of the at least one mounting member for driving the mounting part to move.

11. A bracket device, comprising:
a bracket comprising a side wall and at least one mounting member adjacent to the side wall, the at least one mounting member configured to pass through a mounting hole of a post;
a supporting frame movable relative to the bracket; and
an elastic member attached to the supporting frame;
wherein during a process of the supporting frame being moved relative to the bracket along a direction from a first position to a second position, the supporting frame is configured to drive the at least one mounting member to move relative to the side wall of the bracket;
wherein the elastic member comprises a first engaging feature, the bracket comprises a second engaging feature and a third engaging feature, when the supporting frame is located at the first position relative to the bracket, the first engaging feature of the elastic member is engaged with the second engaging feature, such that the supporting frame is held at the first position relative to the bracket, and when the supporting frame is located at the second position relative to the bracket, the first engaging feature of the elastic member is engaged with the third engaging feature, such that the supporting frame is held at the second position relative to the bracket.

12. The bracket device of claim 11, wherein one of the bracket and the supporting frame defines a space, and the bracket and the supporting frame are movable relative to each other through the space.

13. The bracket device of claim 11, wherein the bracket further comprises a base adjacent to the side wall, the at least one mounting member is movably mounted to the base, the bracket device further comprises a fastening member connected to the bracket, and the fastening member is configured to lock the post.

14. The bracket device of claim 13, wherein the bracket further comprises an end wall substantially perpendicularly connected to the side wall, and the base is attached to the end wall.

15. The bracket device of claim 14, further comprising a driving structure arranged on the supporting frame, wherein during the process of the supporting frame being moved relative to the bracket along the direction from the first position to the second position, the driving structure is configured to drive the at least one mounting member to move relative to the side wall of the bracket.

16. The bracket device of claim 15, wherein the driving structure comprises at least one driving part, the at least one mounting member comprises a mounting part and a contact part connected to the mounting part, the at least one driving part of the driving structure is connected to the contact part of the at least one mounting member for driving the mounting part to move.

17. The bracket device of claim 16, further comprising at least one auxiliary elastic member configured to provide an elastic force to the at least one mounting member.

* * * * *